(12) United States Patent
Tien

(10) Patent No.: US 6,405,334 B1
(45) Date of Patent: Jun. 11, 2002

(54) METHOD AND APPARATUS CHARACTERIZING AC PARAMETERS OF A FIELD PROGRAMMABLE GATE ARRAY INTERNAL CELL ARRAY

(75) Inventor: Ching-Yurn Tien, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/301,358

(22) Filed: Apr. 29, 1999

(51) Int. Cl.[7] .............................................. G01R 31/28
(52) U.S. Cl. ........................................................ 714/725
(58) Field of Search ................................ 714/725, 726; 716/16; 326/38–39

(56) References Cited

U.S. PATENT DOCUMENTS

| 5,488,612 A | * | 1/1996 | Heybruck | 714/725 |
| 5,497,378 A | * | 3/1996 | Amini et al. | 714/726 |
| 5,991,907 A | * | 11/1999 | Stroud et al. | 714/725 |
| 6,003,150 A | * | 12/1999 | Stroud et al. | 714/725 |
| 6,202,182 B1 | * | 3/2001 | Abramovici et al. | 714/725 |

OTHER PUBLICATIONS

Renovell et al., RAM–Based FPGA's: A Test Approach for the Configurable Logic, IEEE, pp. 1 to 5, Feb. 1998.*
Renovell et al., SRAM–Based FPGA's Testing the Interconnect/Logic Interface, IEEE, pp. 266 to 271, 1998.*
Renovell et al., Test Pattern and Test Configuration Generation Methodology for the Logic of RAM–Based FPGA, IEEE, pp. 254 to 259, 1997.*

* cited by examiner

*Primary Examiner*—Albert Decady
*Assistant Examiner*—Shelly A Chase

(57) ABSTRACT

A method and arrangement for characterizing the AC parameters of a field programmable gate array (FPGA) internal cell array configures cell elements within internal cells to form a plurality of test units. The test units are chained together to form a verify chain. By proper configuration of the cell elements within the test units, to form a pattern generator, a unit under test, and a register, the AC parameters of the entire FPGA internal cell array may be tested.

11 Claims, 6 Drawing Sheets

Fig. 1
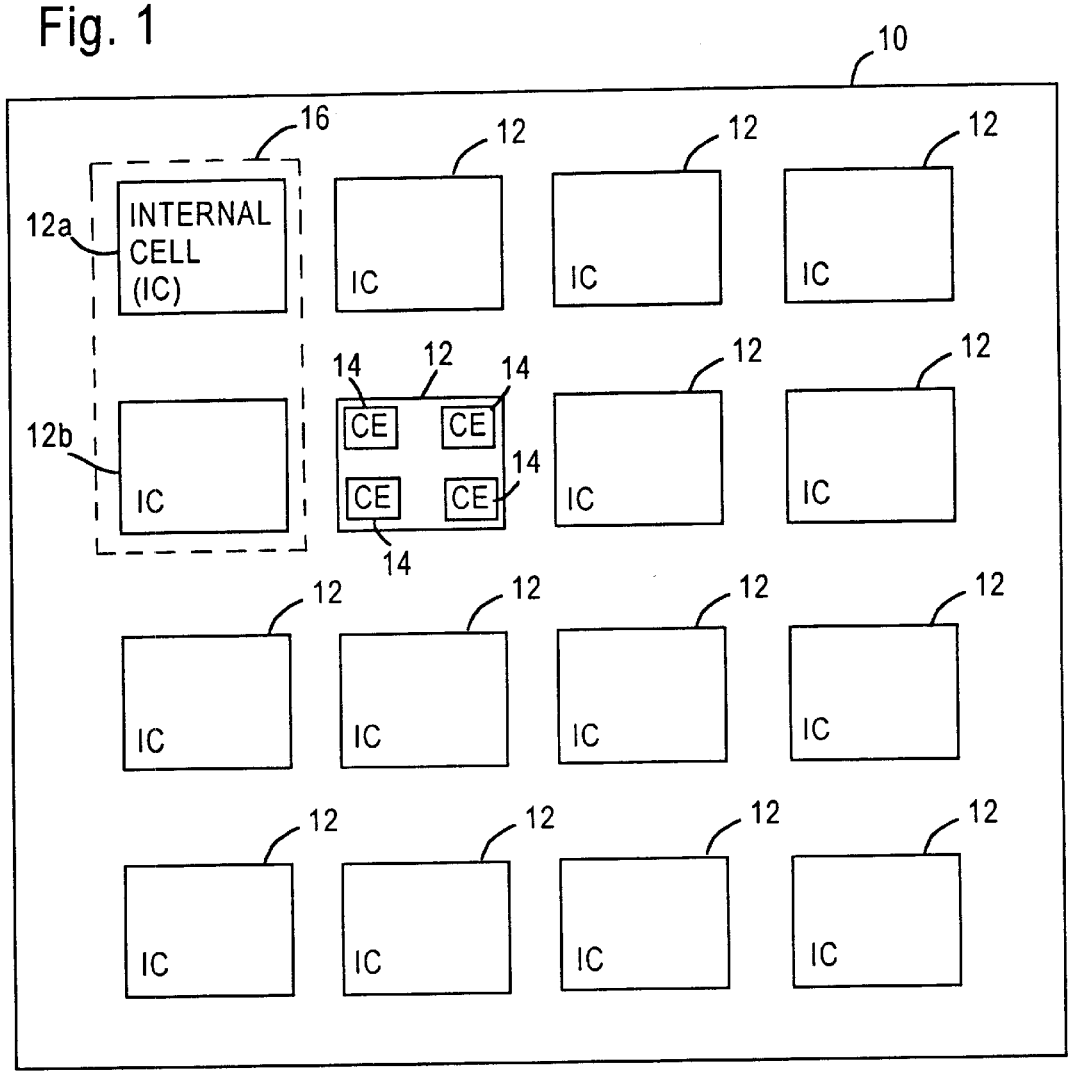
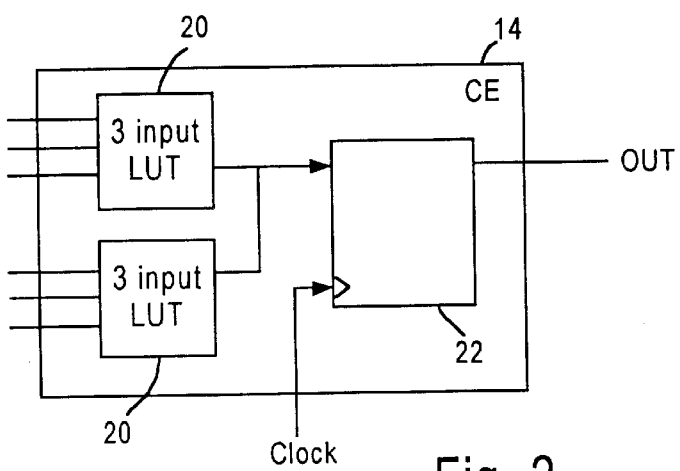
Fig. 2

METHOD AND APPARATUS CHARACTERIZING AC PARAMETERS OF A FIELD PROGRAMMABLE GATE ARRAY INTERNAL CELL ARRAY

FIELD OF THE INVENTION

The present invention relates generally to field programmable gate arrays (FPGAS) and, more particularly, to methods and apparatus for characterizing the AC parameters of an FPGA internal cell array.

BACKGROUND OF THE INVENTION

Gate arrays and field programmable gate arrays (FPGAs) are well known in the art. In general, a gate array is an integrated circuit that includes a plurality of predetermined transistor sizes determined by the manufacturer or vendor. Once the transistor size is set, the plurality of transistors are deposited, in layers, on a substrate to form a base or generic array. The manufacturer creates a library of logic cells by combining a plurality of transistors.

When a user identifies a specific need or functionality for a gate array, the final layer(s) are deposited over the base array, customizing the gate array in accordance with the user's needs. The individual logic cells are connected together in such way so as to achieve an output desired by the user. After the gate array is manufactured, its internal logic is set and cannot be altered.

Although the cost of the final customized layers are borne by the user, savings are realized since the manufacturing costs associated with producing the base array of transistors is spread over a large number of gate arrays.

Static random access memory (SRAM) based FPGAs are integrated circuits that are electrically programmable by the user/customer. The configuration of the FPGA may be changed from time to time to provide different outputs from the same integrated circuits when the user applies external control signals and a data stream to the FPGA. An FPGA includes a plurality of configurable elements (e.g., AND gates, NOR gates, XOR gates, Flip-Flops, inverters and RAM) which, when connected together, form more complex functions. Furthermore, each configurable element can be connected together to provide even more complex functions. A specific function to be carried out by the configurable element is determined directly by the control signals and the data stream applied to the FPGA and, ultimately, to the configurable elements within the FPGA. In a common operation, the control signals are generated, and the data stream is stored and transmitted by control logic to the FPGA. An example of external control logic for generating the control signals is a microprocessor after storing the data stream in an erasable programmable read only memory (EPROM) chip.

In order to determine the functioning of the FPGA internal cell array, it is necessary to check the AC parameters of the array. These include the interconnect delays, the propagation delay timing, the set up and hold times, and the clock widths. In order to test the AC parameters of each of the internal cells in the array, separate connections to the cells are normally used to provide inputs to the cells and determine the outputs from the individual cells. However, such an arrangement requires a large number of test pins to provide inputs and receive outputs from the large number of individual cells in the array. This discourages the checking of the AC parameters of each of the internal cells of the array.

SUMMARY OF THE INVENTION

There is a need for an AC parameter characterization arrangement for a field programmable gate array with a reduced number of inputs and outputs, but allows each of the internal cells in the array to have its operating parameters tested.

This and other needs are met by embodiments in the present invention which provide a test logic configuration for testing operating parameters of a field programmable gate array (FPGA). The FPGA has N×N configurable logic blocks. A first configurable logic block of the N×N array is configured as a pattern generator. The same or a second logic block of the N×N array is configured as a register. Another logic block of the N×N array is configured as a block under test and is coupled to the pattern generator and the register for testing of the operating parameters of the FPGA.

The earlier stated needs are also met by another embodiment of the present invention which provides an alternating current (AC) parameter characterization arrangement for a programmable gate array having an N×N internal cell array. The arrangement comprises N×N/M testing units in a programmable gate array. The testing units are serially coupled to form a chain of testing units with a single test output. Each testing unit comprises M internal cells. These internal cells include a first internal cell configured as a pattern generator that generates stimulation input, and the same or a second internal cell coupled to the pattern generator and configured as a verify register that stores output data. In preferred embodiments of the invention, all testing units include one internal cell configured as a unit under test coupled between the pattern generator and the verify register. The output of the pattern generator is received at the input of the unit under test, and the output of the unit under test is coupled to the first input of the multiplexed input arrangement.

Some of the advantages provided by the present invention are the reduced number of pins required to test each of the array cells. The testing of all of the AC parameters may be provided by controlling two clock pins, one set/reset pin, and one mode select pin and observing the output from a single primary output. Another advantage of the invention is that the cells may be reconfigured so that each of the internal cells may be tested.

Additional advantages and novel features of the invention will be set forth in part in the description which follows, and in part may become apparent to those skilled in the art upon examination of the following or may be learned by practice of the invention.

BRIEF DESCRIPTION OF THE DRAWINGS

FIG. 1 is a block diagram of a field programmable gate array constructed in accordance with an embodiment of the present invention.

FIG. 2 is a block diagram of a single cell element in accordance with an embodiment of the present invention.

DETAILED DESCRIPTION OF THE INVENTION

Figure 3:
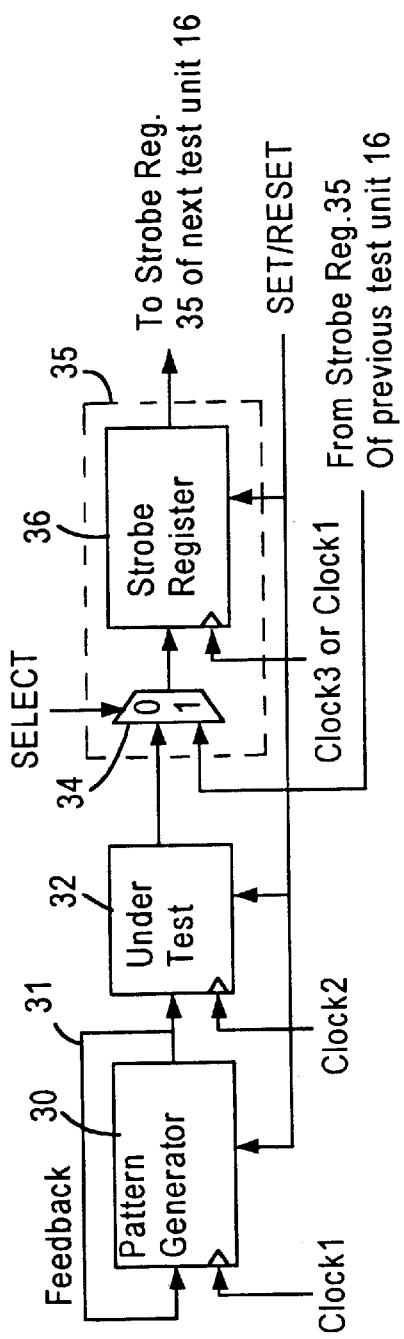
FIG. 3 depicts a block diagram of a single test unit such as shown in FIG. 1, constructed in accordance with an embodiment of the present invention.

The present invention provides a strategy for characterizing the AC parameters for a FPGA internal cell array by controlling a limited number of primary inputs and observing from a single primary output. The portable AC characterization patterns that are generated can be easily converted to any device and any package.

FIG. 1 depicts a block diagram of a field programmable gate array 10 constructed in accordance with an embodiment of the present invention. The FPGA 10 is divided into a number of internal cells 12 in a regular grid array. The internal cells are arranged in N rows and N columns. For the purposes of explanation and ease of illustration, a 4×4 array of internal cells is depicted in FIG. 1. However, it should be understood that this is exemplary only, as a greater or lesser number of cells 12 may be provided without departing from the invention.

Each of the internal cells 12 has the same internal configuration. An individual internal cell 12 includes four cell elements 14. Each of the cell elements 14 is the same as the other cell elements 14 within the internal cell 12 and throughout the FPGA 10.

As will be explained in more detail later, two or more internal cells 12 may be configured to form a single test unit 16. This is indicated in FIG. 1 by the dashed lines enclosing internal cells 12a and 12b to form a single test unit 16.

An exemplary embodiment of a single cell element 14 is depicted in the block diagram of FIG. 2. Each cell element 14 has two look-up tables 20. In an exemplary embodiment of the invention, the look-up tables are 3-input, 8-bit look-up tables (LUT). The look-up tables 20 provide their output to register 22 which produces the output of the cell element 14. Instead of two 3-input logic functions, the cell element 14 may be configured to provide one 4-input logic function by tieing together selected inputs to the two 8-bit look up tables 20. In the preferred embodiment of the present invention, however, the cell element 14 is configured to have two 3-input look-up tables 20.

An exemplary field programmable gate array such as described in FIGS. 1 and 2, to be tested and suitable for configuration in the manner of the present invention described below, is available from Vantis of Sunnyvale, Calif., such as the Vantis VF1 field programmable gate array. This is exemplary only, however, as the invention is not limited to the specific FPGA described in FIGS. 1 and 2, but may be configured within other FPGAs that have repeating cells and cell elements.

In the present invention, at least two of the internal cells 12, such as internal cells 12a and 12b of FIG. 1, are configured to form various units that together make up a test unit 16. A block diagram of a single test unit configured in accordance with embodiments of the present invention is depicted in FIG. 3.

The test unit 16 is divided into three separate logical units. The first of these is a pattern generator 30 whose function is to generate a pattern or stimulation input, such as a 010101 signal. The pattern generator 30 is a toggle (T) flip-flop since it has to generate the pattern itself. The pattern generator 30 is clocked by a first clock signal (CLOCK1). This is the same clock that is provided as a global clock to each of the cell elements 14 within a single internal cell 12.

Figure 4:
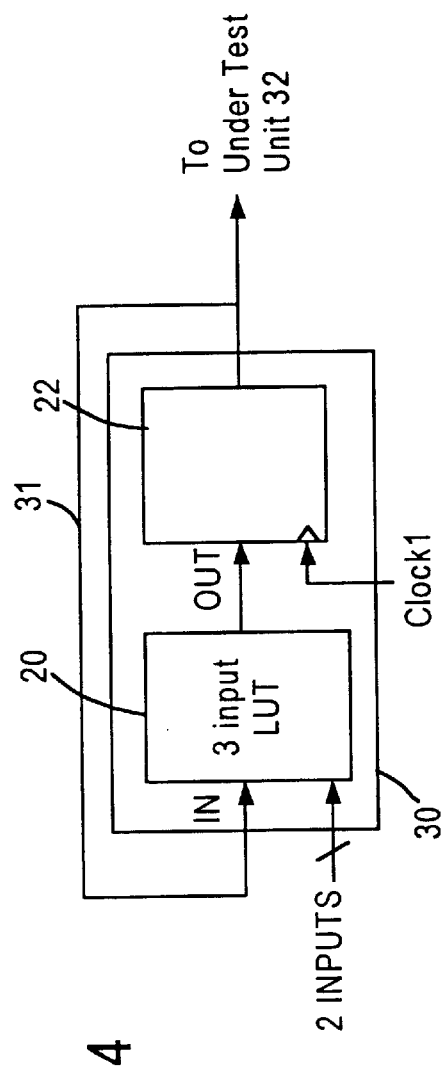
FIG. 4 is a block diagram of the pattern generator function unit depicted in FIG. 3 in accordance with embodiments of the present invention.

An exemplary embodiment of a single cell element 14 configured in accordance with the present invention as a pattern generator function unit 30 is provided in FIG. 4. A single cell element 14 includes, as earlier depicted in FIG. 2, two look up tables 20 and an output register 22. The output register 22 is clocked by CLOCK1 as noted earlier. Only one of the 3-input look-up tables 20 is utilized in this configuration, and is configured as a 3-input look-up table. A feedback path 31 is provided from the output of cell element 14 (i.e., the output latch 22) to one of the inputs of the look-up table 20. The other two inputs of the look-up table 20 are not utilized. In operation, the look-up table data selected is always toggled so that the signal being output by the look-up table 20 always has an opposite state to the state of the input signal received over the local feedback line 31. Hence, the pattern generator function unit essentially operates as a T flip-flop to generate a 01010101 input stimulus to an under test function unit 32 depicted in FIG. 3.

Referring back to FIG. 3, the pattern generator 30 produces an input stimulus that is received by the under test function unit 32. The under test function unit 32 may be configured as a register to check certain ones of the AC parameters, or may be configured as a combinational path (bypass) to check other parameters. The function of the under test function unit 32 is to operate as either a D flip-flop or a T flip-flop to capture the data from the pattern generator function unit 30 and forward this data to a strobe register function unit 35. This unit 35 includes a multiplexer 34 and strobe register logic 36.

Figure 5:
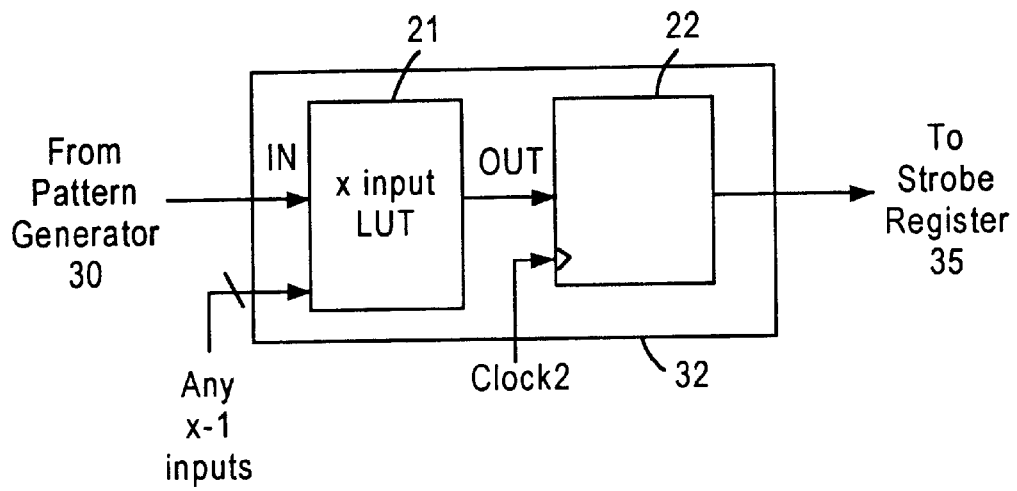
FIG. 5 is a block diagram of an under test function unit such as depicted in the test unit of FIG. 3, constructed in accordance with an embodiment of the present invention.

An exemplary embodiment of a cell element 14 configured as an under test function unit 32 is provided in FIG. 5. The cell element 14 is one of the four cell elements within a second internal cell 12b that is different than the internal cell 12a that also forms part of a single test unit 16. The cell element 14 of the under test function unit 32 needs to be in a different internal cell 12b from the pattern generator function unit 30, which may be in internal cell 12a, for example. This is because the pattern generator function unit 30 and the under test function unit 32 require separate clocks, and only one global clock can be selected for each internal cell 12.

As depicted in FIG. 5, a single cell element 14, or in other embodiments multiple cell elements 14, of an internal cell 12 is configured as a 3, 4, 5 or 6 input look-up table 21. This look-up table 21 is referred to as the X-input look-up table in comparison to the 3-input look-up table 20 of the pattern generator function unit 30. The under test function unit 32 also includes an output register 22 which receives the output of the X-input look-up table 21. The output register 22 is clocked by a second global clock, CLOCK2, and provides an output to the strobe register function unit 35.

The under test function unit 32 may be configured as a register and when so configured, allows the checking of the AC parameters of set up time (tSU), the hold time (tHOLD), and the clock to output delay (tCO) as well as the interconnection delays for the under test function unit 32. The under test function unit 32 can also be configured as a combinational path (bypass) to check the propagation delay (tPD) of the under test function unit 32.

The state of the output signal from the X-input look-up table 20 may be the same as or the opposite state of the input signal from the pattern generator function unit 30. The under test function unit 32 acts as a D flip-flop or a T flip-flop to capture the data and forward the data from the pattern generator function unit 30 the strobe register function unit 35.

Figure 6:
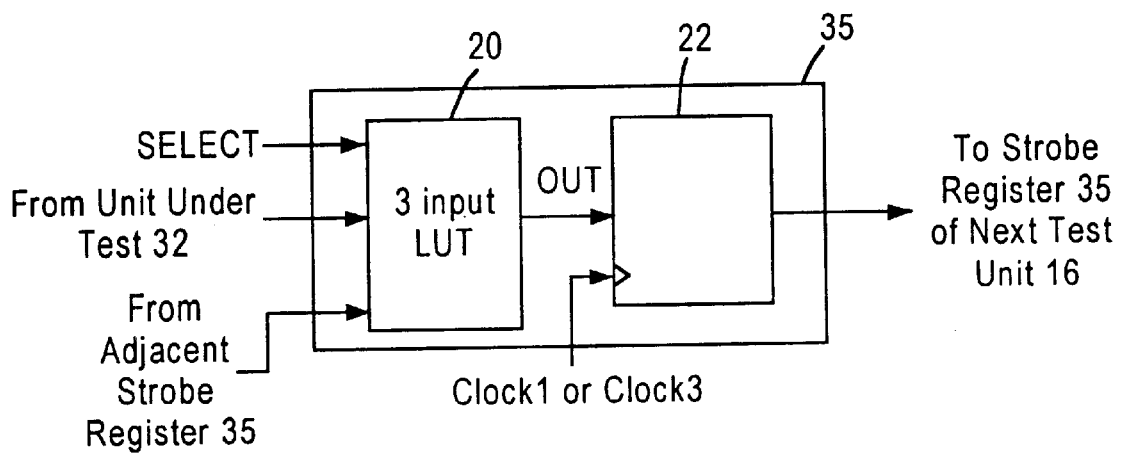
FIG. 6 is a block diagram of a strobe register and multiplexer unit, such as depicted in FIG. 5, constructed in accordance with an embodiment of the present invention.

The strobe register function unit 35 includes a multiplexer 34 and strobe register logic 36, as depicted in FIG. 3. The strobe register function unit 35 is depicted in more detail in the block diagram of FIG. 6. The strobe register function unit 36 is configured from a cell element 14. In certain embodiments, the cell element 14 is part of the same internal cell 12a as cell element 14 configured as the pattern generator function unit 30. In other embodiments, the cell element 14 is part of a third internal cell 12c. However, when the under test function unit 32 is configured as a register, the under test function unit 32 and strobe register function unit 35 may not be in the same internal cell 12b since only one global clock can be selected per internal cell 12.

The cell element 14 configured as the strobe register function unit 35 includes a 3-input look-up table 20 that incorporates the functionality of the multiplexer 34. Hence, the multiplexer 34 is not depicted as a separate element in the strobe register function unit 35 of FIG. 6.

The 3-input look-up table 20 receives a select signal at a first one of its inputs from a primary input or from the register of another internal cell 12. At a second input the signal from the under test function unit 32 is received. The third input receives the signal from a previous adjacent strobe register function unit 35.

The strobe register function unit 35 acts as a multiplexing scan cell. If the select signal equals zero (SELECT=0), then the output from the 3-input look up table 20 equals the output from the under test function unit 32. If the select signal does not equal zero, (SELECT=1), then the output signal from the 3 input look-up table 20 is equal to the output from adjacent strobe register function unit 35.

The configuration of the cell elements 14 in the manner described above is readily performed by one of ordinary skill in the art of field programmable gate arrays given the description above.

Figure 7:
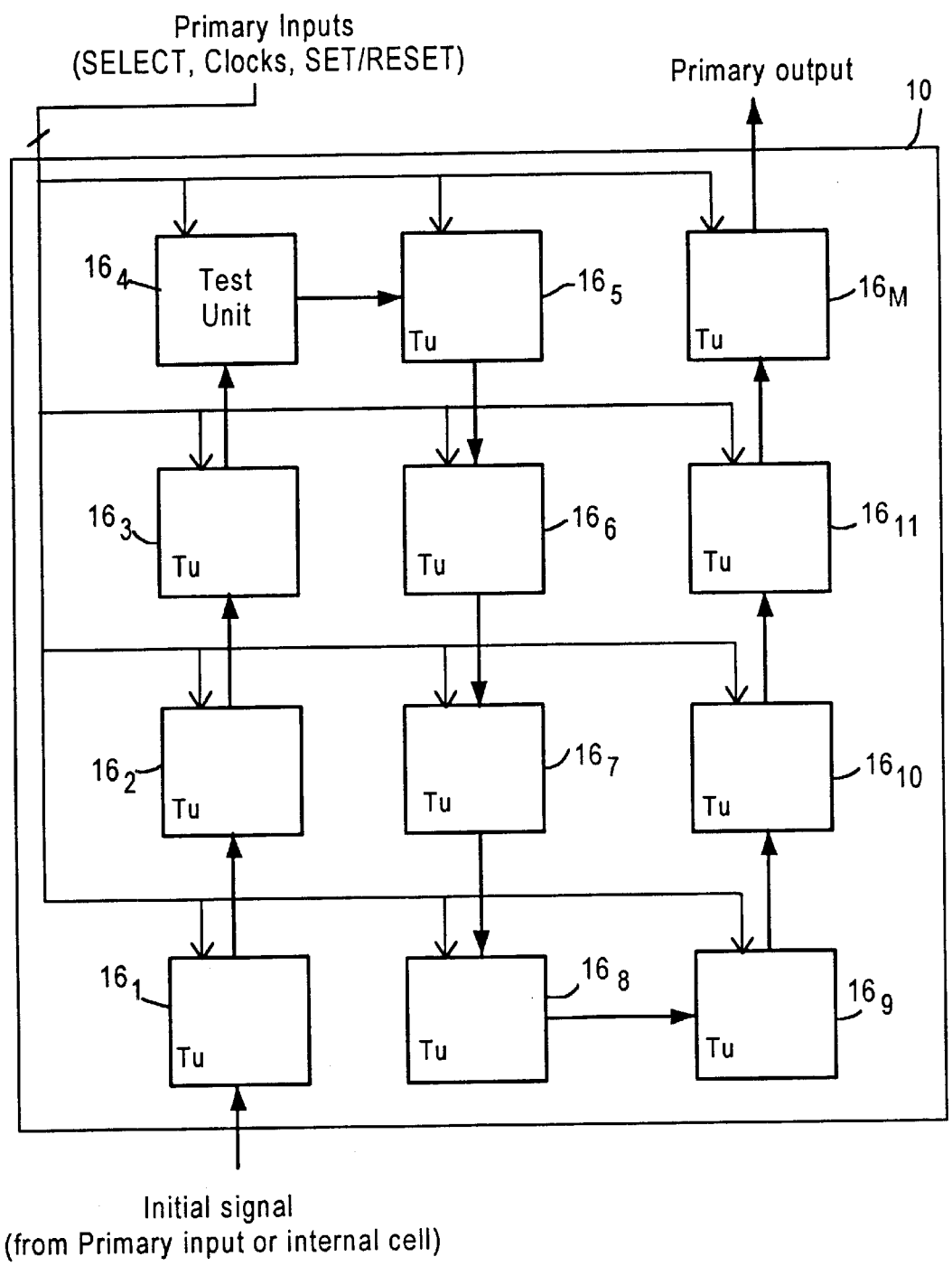
FIG. 7 is a block diagram of a verify chain formed by a plurality of test units, such as depicted in FIGS. 1 and 3, constructed in accordance with an embodiment of the present invention.

The individual internal cells 12 of the FPGA 10 are grouped together to form a plurality of test units 16 on the FPGA 10. Only one such grouping is depicted in FIG. 1, but the other internal cells 12 may be similarly grouped into additional test units. The test units 16 are connected together to form a verify chain as depicted in FIG. 7. The verify chain is a shift register chain comprising N×N/M test units 16. Each of the test units 16 are connected by the strobe register function unit 35 of the individual test units. The strobe register function unit 35 of the last test unit $16_M$ of the verify chain is connected to a primary output whose function is to scan the output pin of the scan chain. One of the inputs of the strobe register function unit 35 of the first test unit 16, in the verify chain is from a primary input or from the register output of any internal cell 12.

By setting the select signal equals zero (SELECT=0) and pulsing the clock of the strobe register function units 35, an at-speed test result can be captured into the strobe register function unit of each test unit 16. By selecting SELECT=1 and continuing the pulsing of the clock of the strobe register function unit 35, the at speed test result inside the strobe register function unit 35 of each test unit 16 can be shifted out of the primary output pin and compared.

The table below provides a configuration for checking different AC parameters in accordance with certain embodiments of the present invention.

| AC Parameters | PatternGenerator | Under Test | Strobe Register | Input Edge | Output Edge |
|---|---|---|---|---|---|
| TCO, tSU, tHOLD . . . | Tff | Tff | Dff | Rising(falling) | Falling(rising) |
| TCO, tSU, tHOLD . . . | Tff | Dff | Dff | Rising(falling) | Rising(falling) |
| tPD | Tff | bypass | Dff | Rising(falling) | Rising(falling) |
| tPD | Tff | Bypass with data inverted | Dff | Rising(falling) | Falling(rising) |

As can be seen from the table, the pattern generator 30 is always configured as a T flip-flop, and the strobe register 35 is always configured as a D flip-flop. The under test function unit 32 may be configured as a T flip-flop to test certain parameters with the input edge rising and the output edge falling. The under test function unit 32 may also be configured as a D flip-flop to test the same AC parameters, but this time with an input edge that is rising and an output edge that is rising, or an input edge that is falling and an output edge that is falling. In order to test the propagation delay, with a rising input edge and a rising output edge or a falling input edge and a falling output edge, the under test function unit 32 is configured as a bypass. In order to test the propagation delay where the input edge is rising and the output edge is falling, and the input edge is falling and the output edge is rising, the under test function unit 32 is configured as a bypass with data inverted.

An exemplary method of performing the testing involves asserting a SET/RESET to set/clear all the flip-flops, and asserting SELECT=0. The signal CLOCK1 is pulsed once on the pattern generator function units 30 to generate the input stimulus with the opposite state of SET/RESET. CLOCK2 is pulsed once if the under test function units 32 are configured either as a D flip-flop or a T flip-flop. CLOCK2 is not pulsed, however, if the under test function unit 32 is not configured as a register. CLOCK3 (or CLOCK1) is pulsed once to latch the at-speed test results into the strobe register function unit 35 of each test unit. The at speed test result of the last test unit (e.g. $16_M$) is shifted out from the strobe register function unit 35 to the primary output at this time. The signal SELECT=1 is asserted and CLOCK3 (or CLOCK 1) is pulsed N×N/M−1 times to shift out and compare the at speed test result of the remaining test units $16_1$ to $16_{M-1}$ in the verified chain.

Each of the steps above, with the exception of the first step of asserting SET/RESET to clear all the flip-flops and making select signal equal 0, are repeated in order to check further input edges.

Figure 8:
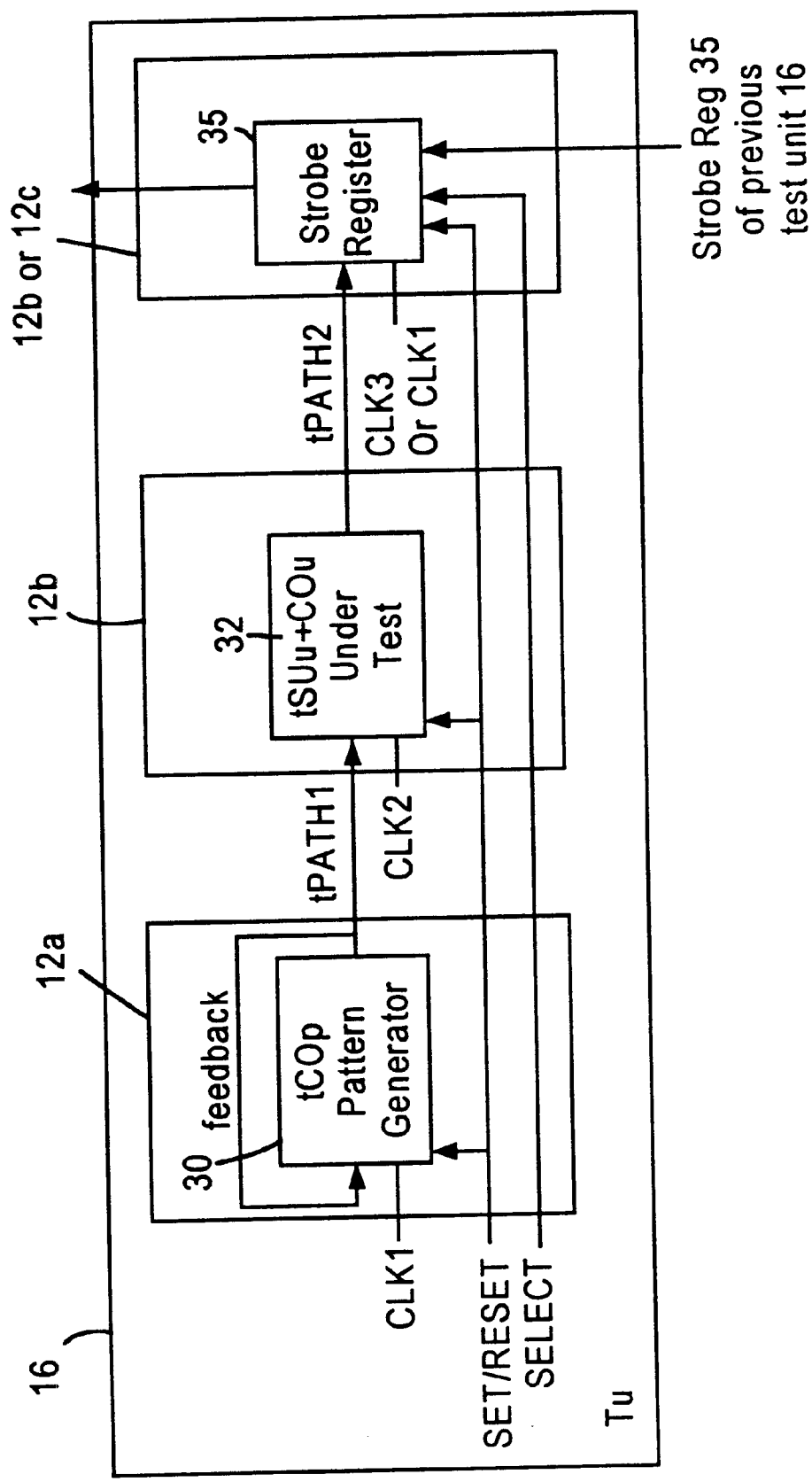
FIG. 8 is a block diagram of a single test unit with exemplary signals to depict an example of a testing of specific AC parameters.

FIG. 8 depicts an exemplary configuration to test the clock to output delay (tCO) of the pattern generator function unit 30, the interconnection delay, the set up time (tSU), and the hold time (tHOLD) of the under test function unit 32. As depicted in FIG. 8, the under test function unit 32 is configured as a register. The delay between CLOCK1 and CLOCK2 is controlled in order to test the above stated parameters. The equation for this is CLK2−CLK1=tCOp+tPATH1+tSUu.

Figure 9:
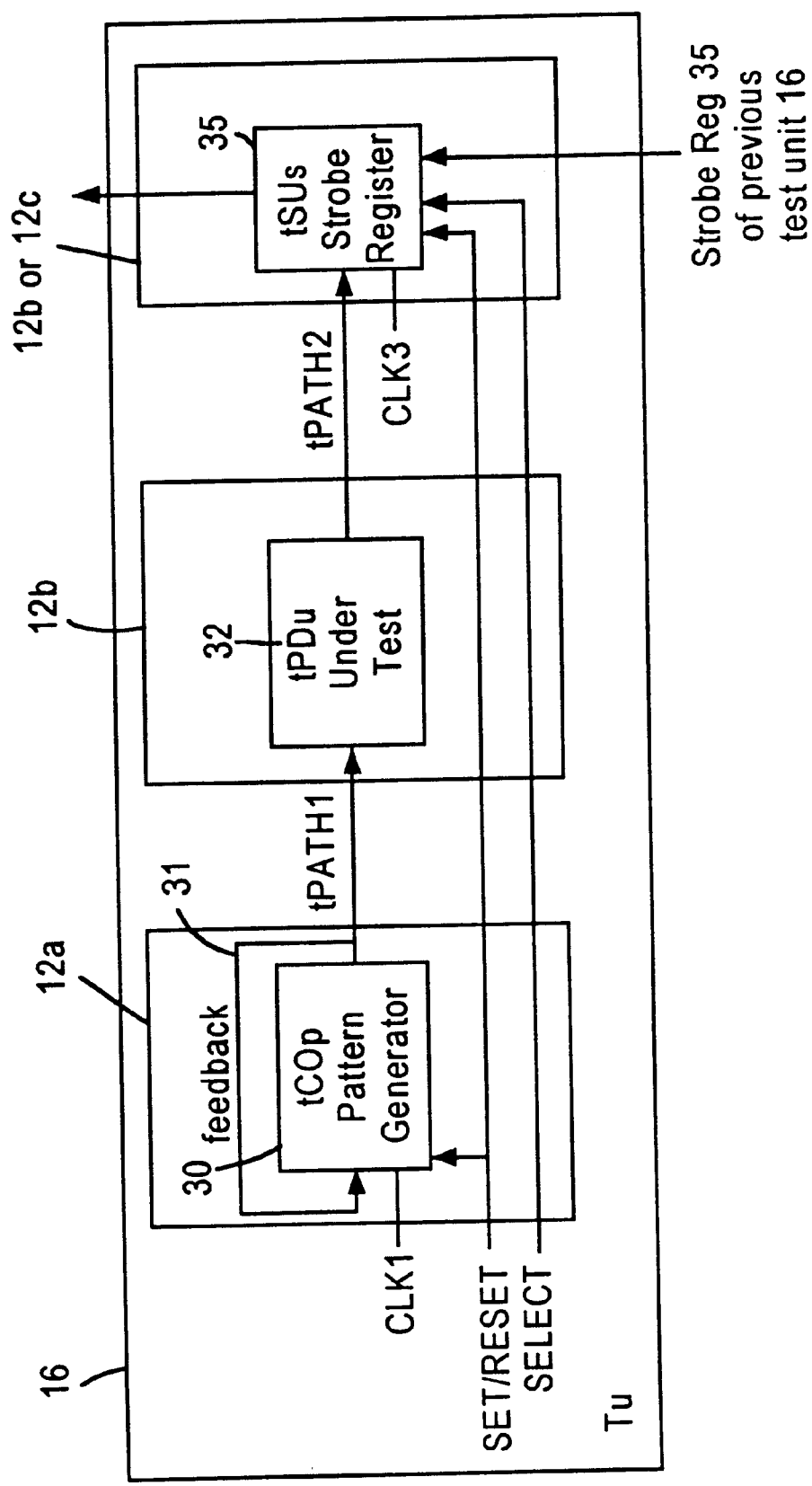
FIG. 9 is a block diagram similar to FIG. 8, depicting another set of AC parameters being tested.

FIG. 9 depicts another configuration in which the under test function unit 32 is configured as a bypass. By controlling the delay between CLOCK1 and CLOCK3, the tCO of the pattern generator function unit 30, the interconnection delay, the propagation delay (tPD) of the under test function unit 32, the interconnection delay, and the tSU of the strobe register function unit 35 can be tested. The equation for this is CLK3−CLK1=tCO+tPATH1+tPDu+tPATH2+tSUs.

All of the AC parameters of cell elements 14 used inside each test unit 16 can be tested by swapping the role of pattern generator 30, under test function unit 32, and strobe register function unit 35. The reconfiguration of the FPGA is readily performed by one of ordinary skill in the art of FPGA. By repeating these test procedures and selecting different cell elements 14 in internal cells 12 to form different test units, all of the interconnection delays, propagation delays, set up times, hold times, and clock width parameters of the entire FPGA internal cell array then can be tested. In accordance with the present invention, this may be done with a minimum of pins, such as two input pins and a single output pin.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. An alternating current (AC) parameter characterization arrangement for a programmable gate array having an N×N internal cell array, comprising:

N×N/M testing units in the programmable gate array, wherein the testing units are serially coupled to form a chain of testing units with a single test output;

each testing unit comprising M internal cells, wherein the M internal cells include first internal cell having 4 cell elements, where one of the 4 cell elements is configured as a pattern generator that generates stimulation input, and another cell element of the same internal cell or one cell element of a second internal cell coupled to the pattern generator and configured as a verify register that stores output data that contains the AC parameter characterization data, and another internal cell is configured as under test function unit.

2. The arrangement of claim 1, wherein the verify register of each testing unit includes a multiplexed input arrangement, with a first input coupled to an output of the unit under test within that testing unit, a second input coupled to an output of the verify register of the preceding testing unit within the chain of testing units, and a select input responsive to a select signal to output at the multiplexed input arrangement the signal present on either the first input or the second input.

3. The arrangement of claim 2, wherein all the test units include a third cell element configured as a unit under test coupled between the pattern generator and the verify register such that the output of the pattern generator is received at an input of the unit under test, and the output of the unit under test is coupled to the first input of the multiplexed input arrangement.

4. The arrangement of claim 3, wherein the pattern generator, the unit under test and the verify register have clock inputs, with the pattern generator and the verify register might receive the same clock signal and the unit under test receiving a different clock signal.

5. The arrangement of claim 4, further comprising means for serially shifting out the output of the verify registers of the testing units to the single test output to determine the AC parameter characterization for each of the testing units within the chain of testing units.

6. The arrangement of claim 5, further comprising a single multiplexer select signal input coupled in common to each of the select inputs of the multiplexed input arrangement.

7. The arrangement of claim 3, wherein the cell elements are reconfigurable cell elements such that each cell element is reconfigurable to operate as the pattern generator, the unit under test, and the verify register in successive testing operations.

8. The arrangement of claim 7, wherein each cell element includes a look up table.

9. The arrangement of claim 1, wherein the pattern generator includes a T-type flip-flop.

10. The arrangement of claim 1, wherein the verify register includes a D-type flip-flop.

11. The arrangement of claim 1, wherein the unit under test includes one of a T-type flip-flop or a D-type flip-flop, or no flip-flop.

* * * * *